(12) United States Patent
Jiang

(10) Patent No.: US 12,035,488 B2
(45) Date of Patent: Jul. 9, 2024

(54) SPLICING-SCREEN DISPLAY DEVICE

(71) Applicant: TCL CHINA STAR OPTOELECTRONICS TECHNOLOGY CO., LTD., Guangdong (CN)

(72) Inventor: Tingting Jiang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/618,477

(22) PCT Filed: Nov. 26, 2021

(86) PCT No.: PCT/CN2021/133619
§ 371 (c)(1),
(2) Date: Dec. 12, 2021

(87) PCT Pub. No.: WO2023/082353
PCT Pub. Date: May 19, 2023

(65) Prior Publication Data
US 2024/0015898 A1   Jan. 11, 2024

(30) Foreign Application Priority Data
Nov. 10, 2021 (CN) .......................... 202111325026.X

(51) Int. Cl.
*G09G 5/00* (2006.01)
*G09F 9/302* (2006.01)
*H05K 5/00* (2006.01)

(52) U.S. Cl.
CPC ......... *H05K 5/0021* (2013.01); *G09F 9/3026* (2013.01)

(58) Field of Classification Search
CPC .... H05K 5/0021; G09F 9/3026; G06F 3/1446
(Continued)

(56) References Cited

U.S. PATENT DOCUMENTS

| 11,017,732 B1 | 5/2021 | Tang |
| 2009/0096711 A1* | 4/2009 | Jang ...................... G06F 3/1446 345/1.3 |

(Continued)

FOREIGN PATENT DOCUMENTS

| CN | 1381030 A | 11/2002 |
| CN | 104900167 A | 9/2015 |

(Continued)

OTHER PUBLICATIONS

Chinese Office Action in corresponding Chinese Patent Application No. 202111325026.X dated Jun. 6, 2022, pp. 1-11.
(Continued)

*Primary Examiner* — Abdul-Samad A Adediran
(74) *Attorney, Agent, or Firm* — PV IP PC; Wei Te Chung; Zhigang Ma

(57) ABSTRACT

The present application provides a splicing-screen display device which includes a display module, a processing module, a distribution module, and a driving module. The display module includes basic display modules and at least one supplementary display module arranged at joints between the basic display modules. The processing module is electrically connected to the display module. The distribution module is electrically connected to the processing module, and sends image signals to the basic display module and the supplementary display module. The driving module is arranged corresponding to the supplementary display module and electrically connected to the supplementary display module.

19 Claims, 8 Drawing Sheets

(58) Field of Classification Search
  USPC .......................................................... 345/1.3
  See application file for complete search history.

(56) References Cited

U.S. PATENT DOCUMENTS

| | | |
|---|---|---|
| 2013/0187832 A1 | 7/2013 | Song |
| 2017/0186400 A1 | 6/2017 | Song et al. |
| 2018/0018931 A1 | 1/2018 | Zhang |
| 2019/0236757 A1 | 8/2019 | Wang |

FOREIGN PATENT DOCUMENTS

| | | |
|---|---|---|
| CN | 205247872 U | 5/2016 |
| CN | 105653224 A | 6/2016 |
| CN | 106507035 A | 3/2017 |
| CN | 110097831 A | 8/2019 |
| CN | 209543815 U | 10/2019 |
| CN | 209994473 U | 1/2020 |
| CN | 111506284 A | 8/2020 |
| CN | 113590066 A | 11/2021 |
| JP | 2008096747 A | 4/2008 |
| WO | 2020011249 A1 | 1/2020 |

OTHER PUBLICATIONS

International Search Report in International application No. PCT/CN2021/133619, mailed on Apr. 24, 2022.

Written Opinion of the International Searching Authority in International application No. PCT/CN2021/133619, mailed on Apr. 24, 2022.

Japanese Office Action issued in corresponding Japanese Patent Application No. 特願 2021-571666 dated Dec. 19, 2023, pp. 1-4.

* cited by examiner

SPLICING-SCREEN DISPLAY DEVICE

FIELD OF DISCLOSURE

The present application relates to a field of display technology and in particular, to a splicing-screen display device.

DESCRIPTION OF RELATED ART

With the development of electronics industry, there is an increasing demand for various super-sized display devices, and the super-sized display devices are extensively used in various application scenarios. Therefore, splicing-screen display devices such as liquid crystal display (LCD) splicing-screen display devices have received more and more attention. The splicing-screen display devices can splice multiple LCD screens to form a super-sized display screen for screen display functions according to actual needs, and have advantages of high-definition screen display and high flexibility.

At present, since the splicing-screen display device integrates multiple different types of display modules, various functional elements that cooperate with the display modules are arranged inside the splicing-screen display device, resulting in an insufficient internal space inside the device.

SUMMARY

The present application provides a splicing-screen display device, which can solve a technical problem that a conventional display device has an insufficient internal space due to having too many components integrated inside.

The present application provides a splicing-screen display device, comprising:
a display module comprising multiple basic display modules and a plurality of supplementary display module, wherein each of the supplementary display modules is arranged at a joint between two basic display modules;
a processing module electrically connected to the display module, wherein the processing module is configured to perform first processing on a received source image to obtain initial sub-basic images corresponding to the basic display modules;
a distribution module electrically connected to the processing module, wherein the distribution module is configured to receive the initial sub-basic images sent from the processing module, perform second processing to obtain a plurality of target sub-supplementary images corresponding to the plurality of supplementary display modules and target sub-basic images corresponding to the basic display modules, send the target sub-supplementary images to the corresponding supplementary display modules, and send the target sub-basic images to the corresponding basic display modules; and
a driving module disposed corresponding to the plurality of supplementary display modules and electrically connected to the distribution module and the supplementary display modules, wherein the driving module is configured to receive the target sub-supplementary images from the distribution module and distribute the target sub-supplementary images to the respective corresponding supplementary display modules for display operations of the supplementary display modules.

Optionally, the processing module comprises:
a first receiving sub-module configured to receive pixel information of the display module and the source image, wherein the pixel information comprises a resolution of each of the basic display modules; and
a first splitting sub-module configured to split the source image into the initial sub-basic images according to the resolutions of the basic display modules.

Optionally, the distribution module comprises:
a second receiving sub-module configured to receive the pixel information of the display module and the initial sub-basic images, wherein the pixel information further comprises a resolution of each of the supplementary display modules; and
a second splitting sub-module configured to perform edge processing on the initial sub-basic images according to the resolutions of the supplementary display modules to form the target sub-supplementary images and the target sub-basic images.

Optionally, the second splitting sub-module comprises:
an image cutting unit configured to cut the initial sub-basic images according to the resolutions of the supplementary display modules to form sub-supplementary display images close to the joints and sub-basic display images away from the joints, a pixel width of each sub-supplementary display image is not greater than a pixel width of the corresponding supplementary display module;
a first framing unit configured to add border display regions on outer sides of the sub-basic display images to form the target sub-basic images, wherein each border display region is parallel to the corresponding joint, and a pixel width of each border display region is equal to a pixel width of the corresponding sub-supplementary display image; and
a second framing unit, wherein the second framing unit is configured to add border display regions on outer sides of the sub-supplementary display images to form the target sub-supplementary images, so that outer sides of the target sub-supplementary images are flush with outer sides of the target sub-basic images.

Optionally, the second splitting sub-module comprises:
an image copying unit configured to, according to the resolution of each of the supplementary display modules, copy along one side of each initial sub-basic image close to the corresponding joint to obtain the corresponding target sub-supplementary images; and
an image forming unit configured to use the initial sub-basic images as the target sub-basic images.

Optionally, the driving module comprises:
a substrate
a plurality of driving units integrated on the substrate, wherein the driving units are configured to perform third processing on the received target sub-supplementary images; and
a plurality of output units integrated on the substrate, wherein the output units are electrically connected to the driving unit and the supplementary display module, and is configured to receive the target sub-supplementary images processed by the driving unit and distribute the processed target sub-supplementary images to the corresponding supplementary display modules for the display operations of the supplementary display modules.

Optionally, the driving module further comprises:
a plurality of port units, wherein each port unit is electrically connected to the corresponding driving unit and the distribution module, wherein the port units are configured to receive the target sub-supplementary images sent from the distribution module, and send the target sub-supplementary images to the driving units.

Optionally, the plurality of display interfaces are arranged along the joints on one side of each substrate, and each expansion interface is arranged on one side of the corresponding substrate adjacent to the plurality of display interfaces.

Optionally, the supplementary display units are arranged in a strip shape along the joints, a border width of each supplementary display unit is less than 5 mm, and a pixel width of each supplementary display unit is greater than 8 pixels.

Optionally, a distance between adjacent pixels of two adjacent supplementary display units is less than 0.63 mm.

Optionally, the driving module comprises a plurality of driving sub-modules, the driving sub-modules comprises a primary driving sub-module and a plurality of auxiliary driving sub-modules, the plurality of auxiliary driving sub-modules are disposed on one side of the primary driving sub-module along the corresponding joint, and the primary driving sub-module sends the target sub-supplementary images to the plurality of auxiliary driving sub-modules.

Optionally, each of the primary driving sub-module and the plurality of auxiliary driving sub-modules is provided with multiple port units, and the multiple port units comprise a receiving port and a transmitting port;
  the receiving port of the primary driving sub-module is a primary receiving port, the receiving port of each auxiliary driving sub-module is the auxiliary receiving port, and the transmitting port of the primary driving sub-module is a primary transmitting port; and
  the primary receiving port is electrically connected to the distribution module and configured to receive the target sub-supplementary images sent by the distribution module, and the primary transmitting port is electrically connected to the primary receiving port and each auxiliary receiving port and configured to send the target sub-supplementary images received by the primary receiving port to each auxiliary receiving port.

Optionally, the primary driving sub-module and the auxiliary driving sub-modules are arranged sequentially along the corresponding joint.

Optionally, the driving sub-modules comprises at least one driving board, wherein the driving board comprises:
  a primary driving board comprising one of the plurality of substrates, the plurality of port units, the plurality of driving units, the plurality of output units, and an expansion interface; and
  an auxiliary driving board arranged on one side of the primary driving board along the corresponding joint, wherein the auxiliary driving board comprises one of the plurality of substrates, the plurality of output units, and an expansion interface, and the primary driving board and the auxiliary driving board are coupled and electrically connected to each other through the expansion interfaces.

Optionally, the supplementary display module comprises a plurality of supplementary display sub-modules corresponding to the primary driving sub-module and the plurality of auxiliary driving sub-modules, and the primary driving sub-module and the plurality of auxiliary driving sub-modules are electrically connected to the respectively corresponding supplementary display sub-modules.

Optionally, each supplementary display sub-module comprises a plurality of supplementary display units.

Advantages of the Present Application

In the present application, after processing the initial sub-basic images, the distribution module distributes the target sub-supplementary images and the target sub-basic images. As a result, the present application eliminates a need for having a transmitting module, which is required in conventional techniques to send the target sub-supplementary images to the driving module. Therefore, the present application effectively saves space in the display device, and prevents the device from having an insufficient internal space for having too many components integrated inside. At the same time, the present application also eliminates a need for having an execution unit in the processing module, which is required in conventional techniques to process the source image to obtain the target sub-supplementary images and the target sub-basic images. This way, the present application not only saves space in the display device, but also save manufacturing costs of the display device.

BRIEF DESCRIPTION OF DRAWINGS

In order to more clearly illustrate the embodiments of the present application or related art, figures which will be described in the embodiments are briefly introduced hereinafter. It is obvious that the drawings are merely for the purposes of illustrating some embodiments of the present application, and a person having ordinary skill in this field can obtain other figures according to these figures without inventive work.

DESCRIPTION OF THE ATTACHED DRAWING LABELS

Figure 1:
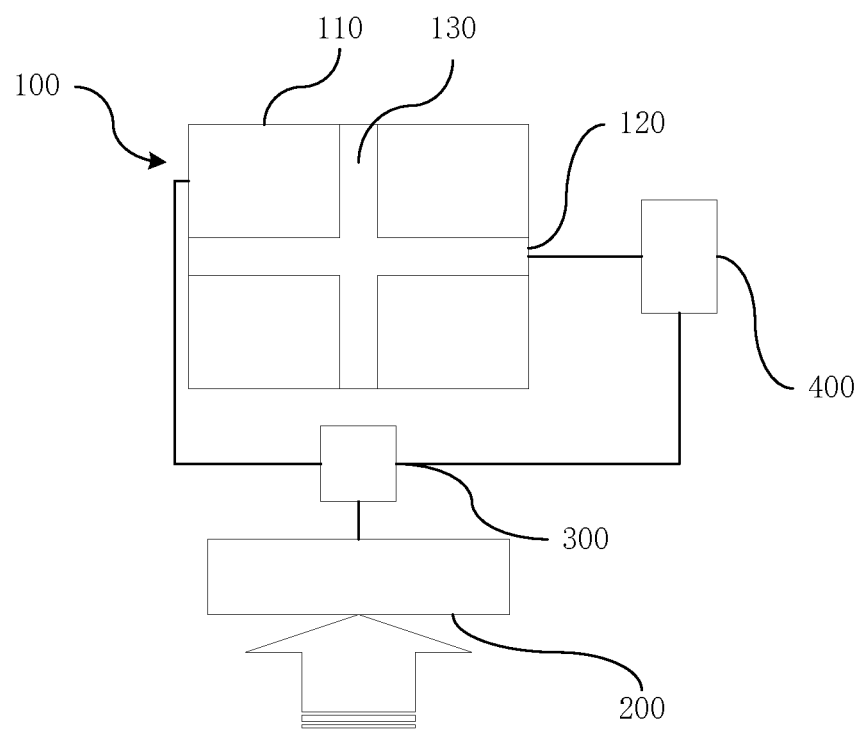
FIG. 1 is a schematic view illustrating a splicing-screen display device according to one embodiment of the present application.

100: display module; 110: basic display modules; 120: supplementary display module; 121: supplementary display sub-module; 1211: supplementary display units; 130: joint; 200: the processing module; 210: first receiving sub-module; 220: first splitting sub-module; 300: distribution module; 310: second receiving sub-module; 320: second splitting sub-module; 330: distribution sub-module; 321: image cutting unit; 322: first framing unit; 323: second framing unit; 324: image copying unit; 325: image forming unit; 400: driving module; 410: port unit; 420: driving unit; 430: output unit; 440: substrate; 450: expansion interface; 401: primary driving sub-module; 402: auxiliary driving sub-module; 403: primary driving board; 404: auxiliary driving board; 411: primary receiving port; 412: primary transmitting port; 413: auxiliary receiving por; 414: auxiliary transmitting port; 431: display interface; 800: source image; 920: border display region; 801: initial sub-basic image; 811: sub-basic display image; 812: sub-supplementary display image; 911: target sub-basic image; 912: target sub-supplementary image.

DETAILED DESCRIPTION OF EMBODIMENTS

Technical solutions of the present application will be clearly and completely described below in conjunction with the accompanying drawings and with reference to specific embodiments of the present application. Obviously, the described embodiments are only some of the embodiments of the present application, rather than all the embodiments. Based on the embodiments in the present application, all other embodiments obtained by those skilled in the art without creative work shall fall within the protection scope of the present application. In addition, it should be understood that the specific embodiments described herein are only used to illustrate and explain the present application, and are not used to limit the present application. In the present application, unless otherwise specified, directional terms such as "upper" and "lower" generally refer to upper and lower directions of a device in actual use or working state, and specifically refer to directions in the drawings. Terms like "inner" and "outer" are referred to with respect to outlines of the device.

The present application provides a splicing-screen display device. Detailed descriptions are given below. It should be noted that an order of the descriptions in the following embodiments is not intended to limit the preferred order of the embodiments.

The present application provides a splicing-screen display device. The splicing-screen display device can be used in various indoor and outdoor super-sized splicing-screen devices and other devices that require display interfaces.

Figure 2:
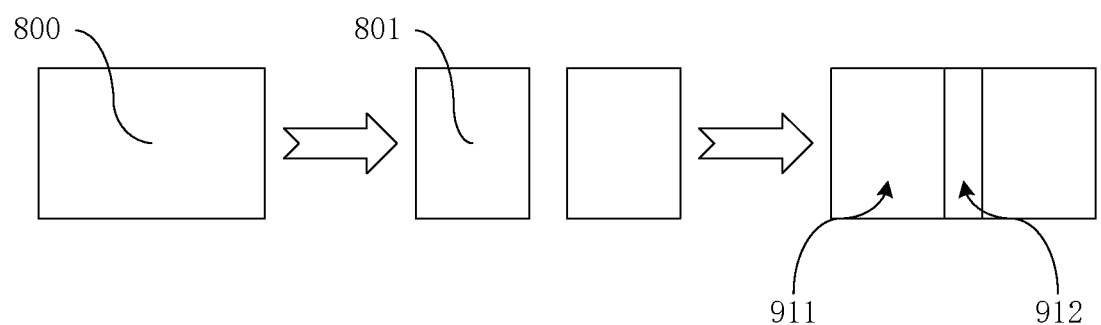
FIG. 2 is a schematic view illustrating image changes of the splicing-screen display device of the embodiment of FIG. 1 according to one embodiment.
Figure 3:
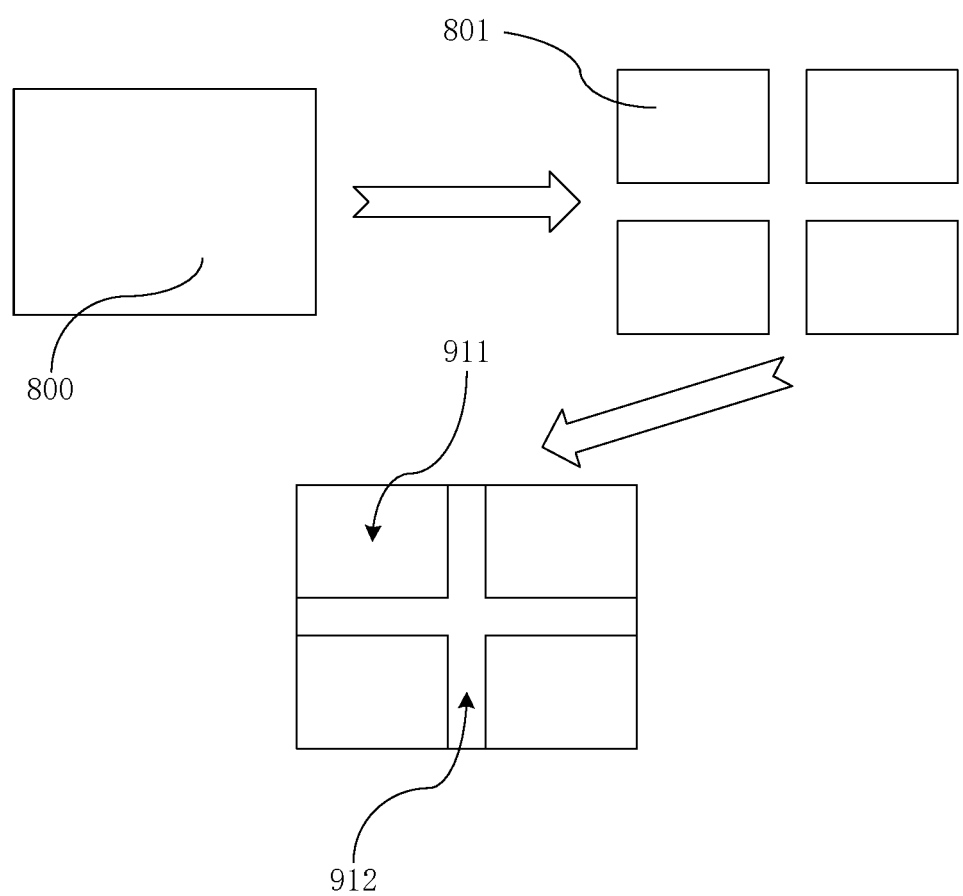
FIG. 3 is a schematic view illustrating image changes of the splicing-screen display device of the embodiment of FIG. 1 according to another embodiment.

Please refer to FIGS. 1 to 3. The splicing-screen display device comprises a display module 100, a processing module 200, a distribution module 300, and a driving module 400. The display module 100 comprises multiple basic display modules 110 and a plurality of supplementary display modules 120. Each of the supplementary display modules 120 is disposed at a joint 130 between corresponding two basic display modules 110. The above-mentioned multiple basic display modules 110 can be arranged in a straight line to form a display screen with a larger screen aspect ratio. The supplementary display module 120 is arranged at the joint 130 between two adjacent basic display modules 110. This arrangement is suitable for application scenarios in movie theaters, game halls, and control centers that require a wide viewing range and for application scenarios like outdoor advertisements that have certain requirements for widths or heights of display screens. The above-mentioned basic display modules 110 can also be arranged in a matrix array to form a display screen with a normal screen aspect ratio. The supplementary display module 120 is arranged at the joint 130 between two adjacent basic display modules 110. This arrangement is suitable for application scenarios in dispatching centers, indoor advertisements, and outdoor advertisements.

The processing module 200 is electrically connected to the display module 100 for performing first processing on a received source image 800 to obtain initial sub-basic images 801 corresponding to the basic display modules 110.

The distribution module 300 is electrically connected to the processing module 200 to receive the initial sub-basic images 801 sent by the processing module 200, perform second processing to obtain a plurality of target sub-supplementary images 912 corresponding to the supplementary display modules 120 and the target sub-basic images 911 corresponding to the basic display modules 110, send the target sub-supplementary images 912 to the corresponding supplementary display modules 120, and send the target sub-basic images 911 to the corresponding basic display modules 110.

The driving module 400 is disposed corresponding to the supplementary display modules 120, and is electrically connected to the distribution module 300 and the supplementary display modules 120. The driving module 400 is configured to receive the target sub-supplementary images 912 sent by the distribution module 300, perform third processing on the target sub-supplementary images 912, and distribute the processed target sub-supplementary images 912 to the supplementary display modules 120.

The above-mentioned first processing is to split the source image 800 into the initial sub-basic images 801 corresponding to the basic display modules 110, and optimize image quality correspondingly. The second processing is to perform processing based on the initial sub-basic images 801 to obtain the target sub-supplementary images 912 corresponding to the supplementary display modules 120 and the target sub-basic images 911 corresponding to the basic display modules 110, and further optimize the image quality correspondingly. The third processing is to convert the target sub-supplementary images 912 into signals that can be displayed by the supplementary display modules 120.

That is to say, in the present embodiment, after receiving the source image 800, the processing module 200 performs the first processing on the source image 800 to obtain the initial sub-basic images 801 corresponding to the basic display modules 110, and sends the initial sub-basic images 801 to the distribution module 300. The distribution module 300 performs the second processing on the initial sub-basic images 801 to obtain the target sub-supplementary images 912 corresponding to the supplementary display modules 120 and the target sub-basic images 911 corresponding to the basic display modules 110. Then, the target sub-basic images 911 are sent to the corresponding basic display modules 110 for driving display operations, and the target sub-supplementary images 912 are sent to the corresponding driving module 400 to drive the supplementary display module 120 to perform display operations.

In the present application, after processing the initial sub-basic images 801, the distribution module 300 distributes the target sub-supplementary images 912 and the target sub-basic images 911. The distribution module 300 integrates a conventional transmitting module configured to send the target sub-supplementary images 912 to the driving module 400, thus effectively saving a space in the display device, and solving a technical problem that the splicing-screen display device has an insufficient internal space resulting from having too many components integrated inside. Also, in the present application, the distribution module 300 also handles some image processing. The distribution module 300 integrates part of image processing functions, which is in the processing module 200 in conventional techniques for processing the source image 800 to obtain the target sub-supplementary images 912 and the target sub-basic screens 911. Accordingly, the present application not only saves the space inside the display device but also saves manufacturing costs for the display device.

Figure 4:
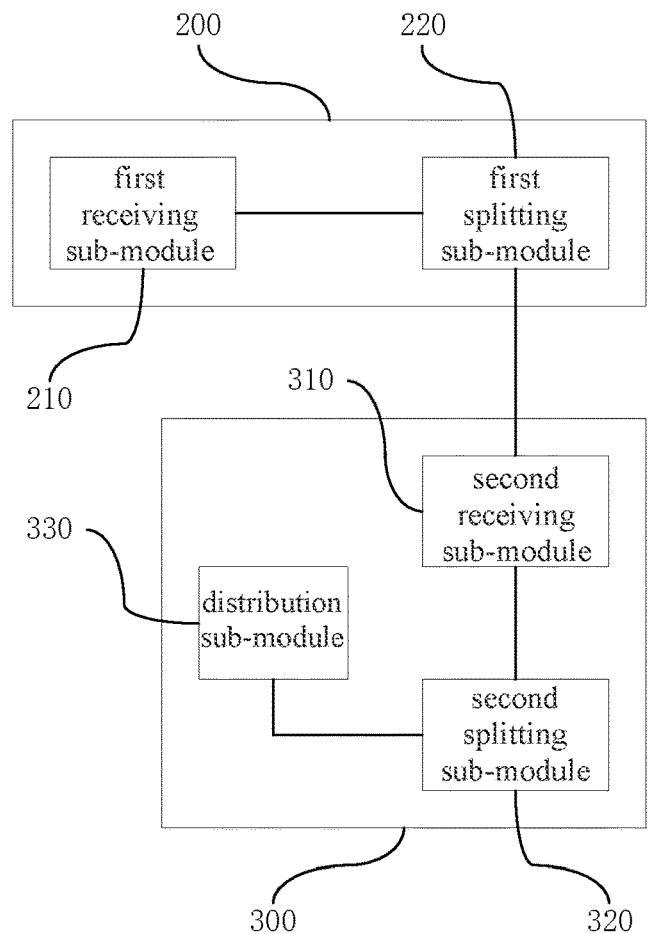
FIG. 4 is a schematic view illustrating architecture of a processing module and a distribution module according to one embodiment of the present application.

Referring to FIG. 4, the processing module 200 comprises a first receiving sub-module 210 and a first splitting sub-module 220. Through the first receiving sub-module 210, the first splitting sub-module 220 receives pixel information of the display module 100 and the source image 800, and then splits the source image 800 into the plurality of initial sub-basic images 801 according to a resolution of each basic display module 110.

The above-mentioned pixel information comprises the resolution of each basic display module 110, a resolution of each supplementary display module 120, and a pixel width of the supplementary display module 120. The pixel width refers to a pixel size of the supplementary display module 120 in a width direction of the joint 130, which is also contained in the resolution of each supplementary display module 120.

In the present embodiment, in addition to the source image 800, the processing module 200 also receives the pixel information of the display module 100. The first processing is to divide the source image 800 into the initial sub-basic images 801 according to the resolution of each basic display module 110.

The distribution module 300 comprises a second receiving sub-module 310, a second splitting sub-module 320, and a distribution sub-module 330. Through the second receiving sub-module 310, the second splitting sub-module 320 receives the pixel information of the above-mentioned display module and the above-mentioned initial sub-basic images 801, and then performs edge processing on the above-mentioned initial sub-basic images 801 according to the resolution of each of the supplementary display modules 120 to form the target sub-supplementary images 912 and target sub-basic images 911. Finally, through the distribution sub-module 330, the target sub-supplementary images 912 and target sub-basic images 911 are distributed to the driving module 400 configured to drive the supplementary display module 120 to perform display operations and to a driving card configured to drive the basic display module 110 to perform display operations. The driving module 400 is used to drive the supplementary display modules 120 to display the corresponding images and the driving card is used to drive the basic display modules 110 to display the corresponding images.

In detail, in the present embodiment, the second processing is to perform the edge processing on the initial sub-basic images 801 according to the resolution of each of the supplementary display modules 120 to form the target sub-supplementary images 912 and the target sub-basic images 911. There are many specific ways to perform the second processing. For example, pixels on edges of the initial sub-basic images 801 are copied to obtain the target sub-supplementary images 912; or the initial sub-basic images 801 are enlarged by a certain scale factor and then are cut to form the target sub-supplementary images 912 and the target sub-basic images 911; or the initial sub-basic images 801 are shifted and cut to create border display regions 920 added to form the target sub-supplementary images 912 and the target sub-basic images 911.

After the initial sub-basic images 801 are shifted and cut, the border display regions 920 are added to form the target sub-supplementary images 912 and the target sub-basic images 911. For specific execution details, please refer to the embodiments shown in FIGS. 5 to 7.

Figure 5:
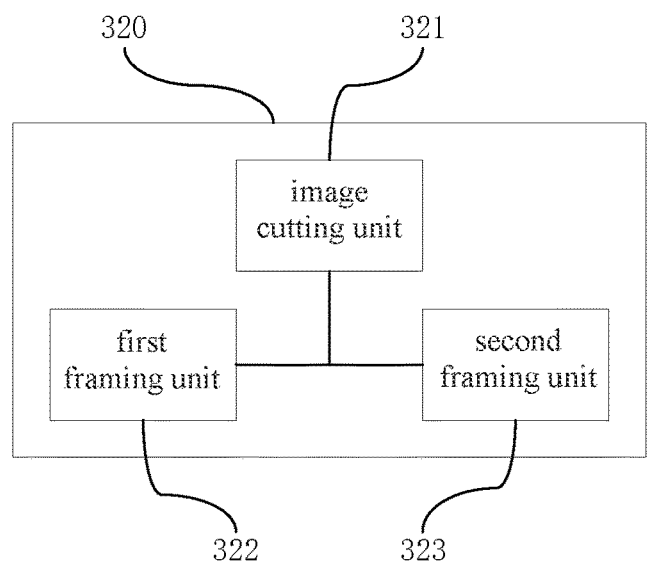
FIG. 5 is a schematic view illustrating architecture of a second splitting sub-module according to one embodiment of the present application.
Figure 6:
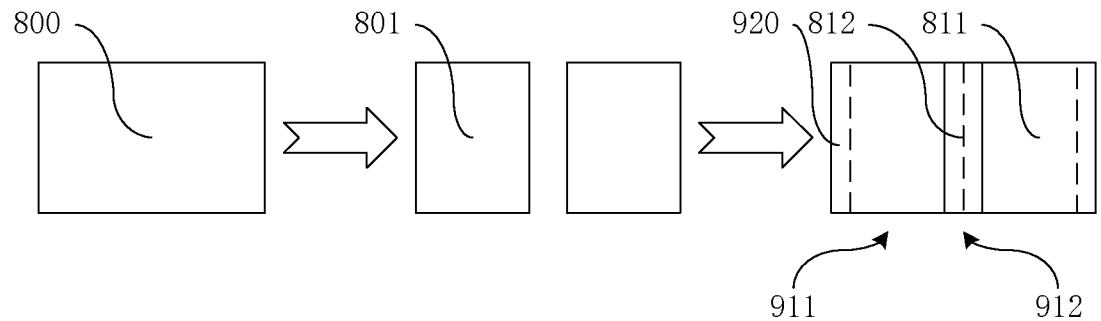
FIG. 6 is a schematic view illustrating image changes of the splicing-screen display device of the embodiment of FIG. 5 according to one embodiment of the present application.
Figure 7:
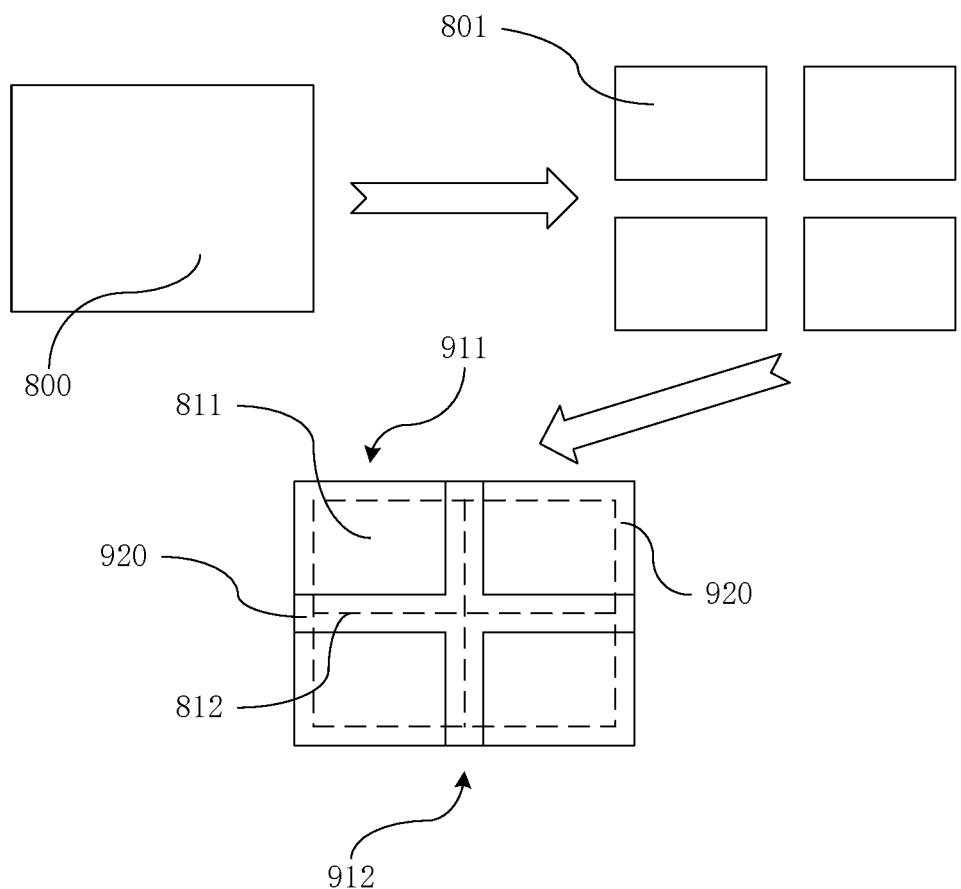
FIG. 7 is a schematic view illustrating image changes of the splicing-screen display device of the embodiment of FIG. 5 according to still another embodiment of the present application.

In one embodiment of the present application, with reference to FIGS. 5 to 7 in combination, the above-mentioned second splitting sub-module 320 comprises an image cutting unit 321, a first framing unit 322, and a second framing unit 323.

The image cutting unit 321 cuts the initial sub-basic images 801 according to the resolutions of the supplementary display modules 120 to form the sub-supplementary display images 812 close to the joints 130 and the sub-basic display images 811 away from the joints 130. The first framing unit 322 adds the border display regions 920 along outer sides of the sub-basic display images 811 to form the target sub-basic images 911. The second framing unit 323 adds the border display region 920 to outer sides of the sub-supplementary display images 812 to form the target sub-supplementary images 912, so that outer sides of the target sub-supplementary images 912 are flush with outer sides of the target sub-basic images 911.

A pixel width of the sub-supplementary display image 812 cut from the initial sub-basic image 801 is not greater than the pixel width of the supplementary display module 120. Since one supplementary display module 120 is adjacent to two basic display modules 110, it means that the image of one supplementary display module 120 can be cut from the image of the adjacent one of the basic display modules 110, or can be cut from the images of two adjacent basic display modules 110. When the image of one supplementary display module 120 is cut from the images of two adjacent basic display modules 110, the sub-supplementary display image 812 cut from one image needs to be spliced with the sub-supplementary display image 812 cut from the other image. Therefore, the pixel width of the sub-supplementary display image 812 is not greater than the pixel width of the supplementary display module 120. At the same time, the border display region 920 is parallel to the joint 130, and a pixel width of the border display region 920 is equal to the pixel width of the sub-supplementary display image 812.

In the present embodiment, the second processing comprises specific execution steps as follows: cutting along sides of the initial sub-basic images 801 close to the joints 130 to obtain the sub-supplementary display images 812 close to the joints 130 and the sub-basic display images 811 away from the joints 130. Then, the border display regions 920 are added to the outer sides of the sub-basic display images 811 (away from the sides of the sub-supplementary display images 812) to form the target sub-basic images 911. The pixel width of the border display region 920 is the same as the pixel width of the sub-supplementary display image 812 cut out previously. In terms of display performance, the sub-supplementary display image 812 and the border display region 920 are symmetrical about a center of the sub-basic display image 811. Finally, the border display regions 920 are added to the outer sides of the sub-supplementary display images 812 to form the target sub-supplementary images 912, so that the outer sides of the target sub-supplementary images 912 are flush with the outer sides of the target sub-basic images 911.

By adding the border display regions 920 around a periphery of the source image 800, the present embodiment solves a problem that pixels are increased by adding the supplementary display modules 120. As a result, a final resolution of the image presented by the display device is consistent with a resolution of the source image 800, ensuring final presentation effects of the image.

The execution steps of the second processing described above are only applicable to a case where four basic display modules 110 are arranged in an array, and a case where two basic display modules 110 are spliced together.

When the execution steps of the second processing described above are applied in the case where two basic display modules 110 are spliced together, the sub-supplementary display images 812 are located in the middle. Accordingly, it does not need to increase the border display regions 920 on the outer sides of the sub-supplementary display images 812 in order to ensure that the outer sides of the target sub-supplementary image 912 are flush with the outer sides of the target sub-basic images 911. Consequently, the second framing unit 323 can directly convert the sub-supplementary display images 812 into the target sub-supplementary image 912 without an actual framing process.

Figure 8:
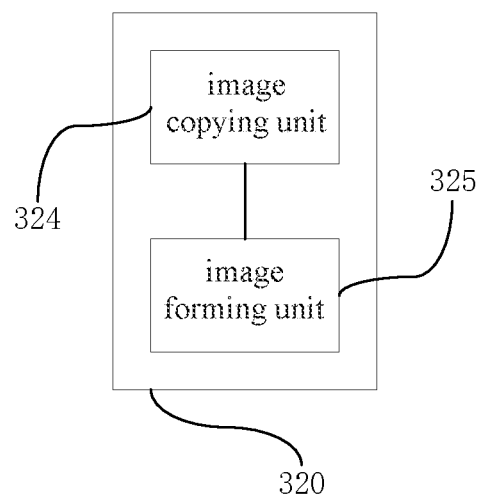
FIG. 8 is a schematic view illustrating the architecture of the second splitting sub-module according to one embodiment of the present application.
Figure 9:
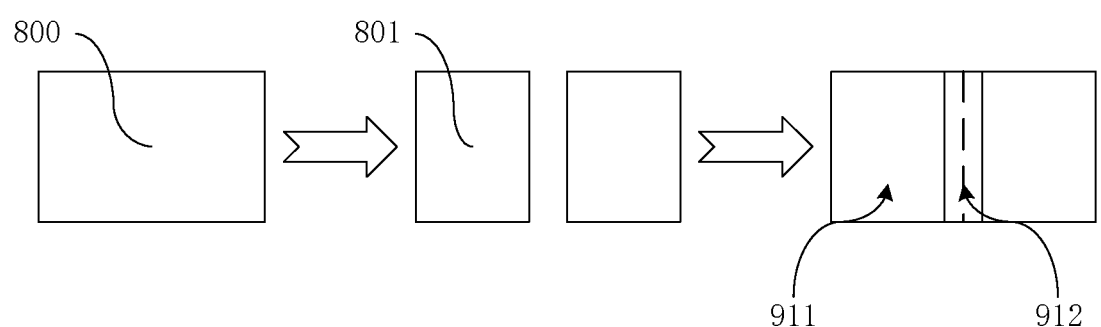
FIG. 9 is a schematic view illustrating image changes of the splicing-screen display device of the embodiment of FIG. 8 according to one embodiment of the present application.
Figure 10:
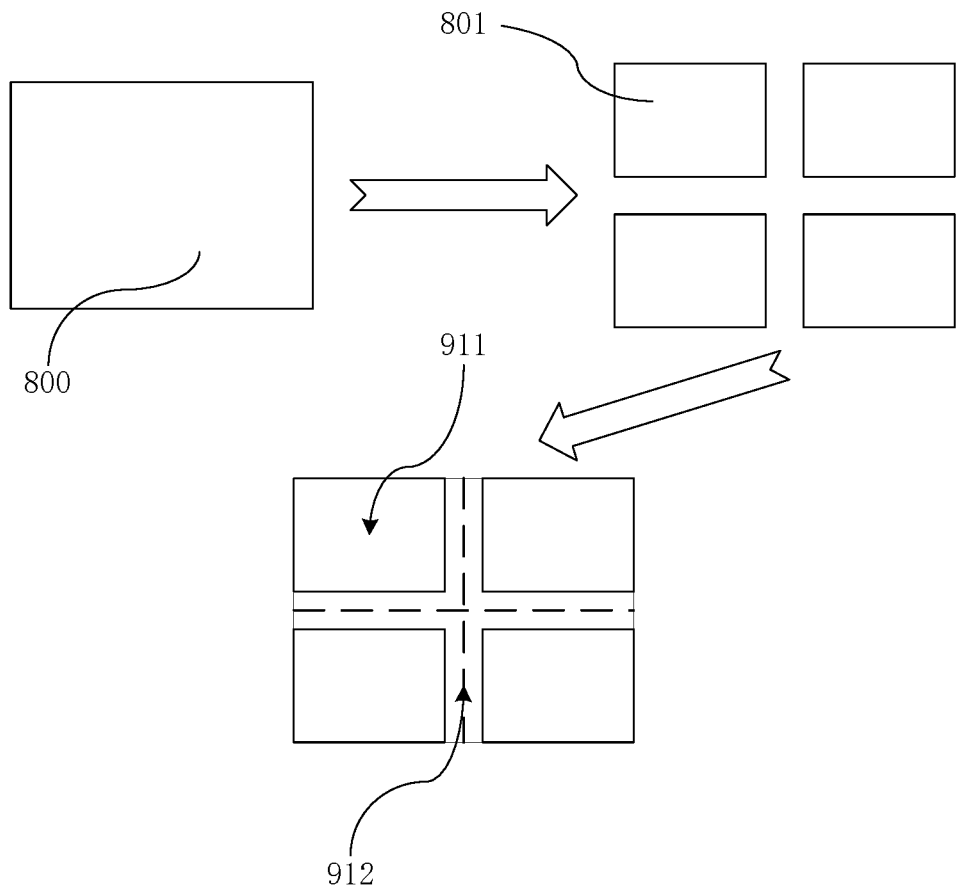
FIG. 10 is a schematic view illustrating image changes of the splicing-screen display device of the embodiment of FIG. 8 according to still another embodiment of the present application.

In another embodiment of the present application, please refer to FIGS. 8 to 10, the above-mentioned second splitting sub-module 320 comprises an image copying unit 324 and an image forming unit 325.

The image copying unit 324 copies along one side of each initial sub-basic image 801 close to the corresponding joint 130 according to the resolution of each supplementary display module 120 to obtain the target sub-supplementary images 912. The image forming unit 325 uses the aforementioned initial sub-basic images 801 as the target sub-basic images 911.

In the present embodiment, the second processing comprises execution steps: copying along one side of each initial sub-basic images 801 close to the joint 130 to obtain the target sub-supplementary images 912, and using the initial sub-basic images 801 as the target sub-basic images 911. That is to say, the target sub-supplementary images 912 are formed by copying the pixels at edges of the initial sub-basic images 801 adjacent to the supplementary display modules 120, and the above-mentioned initial sub-basic images 801 are directly used as the target sub-basic images 911.

Figure 11:
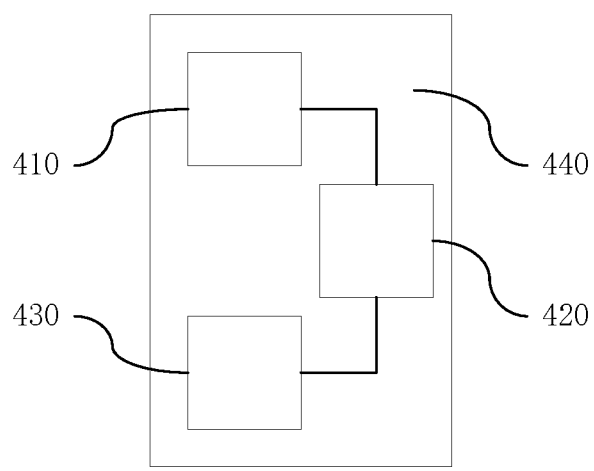
FIG. 11 is a schematic view illustrating architecture of a driving module according to one embodiment of the present application.

Please refer to FIG. 11. The driving module 400 comprises a plurality of port units 410, a plurality of driving units 420, a plurality of output units 430 and a substrate 440. The port units 410, the driving units 420, and the output units 430 are all integrated on the substrate 440. The port unit 410 is electrically connected to the distribution module 300 and the driving unit 420. The output unit 430 is electrically connected to the driving unit 420 and the supplementary display module 120. The port unit 410 is configured to receive the target sub-supplementary images 912 sent from the distribution module 300. The driving unit 420 is configured to perform the third processing on the target sub-supplementary images 912 received by the port unit 410. The output unit 430 is configured to receive the target sub-supplementary images 912 processed by the driving unit 420 and send the target sub-supplementary images 912 to the corresponding supplementary display modules 120, so that the supplementary display modules 120 can perform display operations.

In detail, in the present embodiment, the port unit 410 receives the target sub-supplementary images 912 sent by the distribution module 300, and transmits the target sub-supplementary images 912 to the driving unit 420. The driving unit 420 performs the third processing on the target sub-supplementary images 912 from the port unit 410, and then the output unit 430 controls the supplementary display modules 120 to display the target sub-supplementary images 912.

Figure 12:
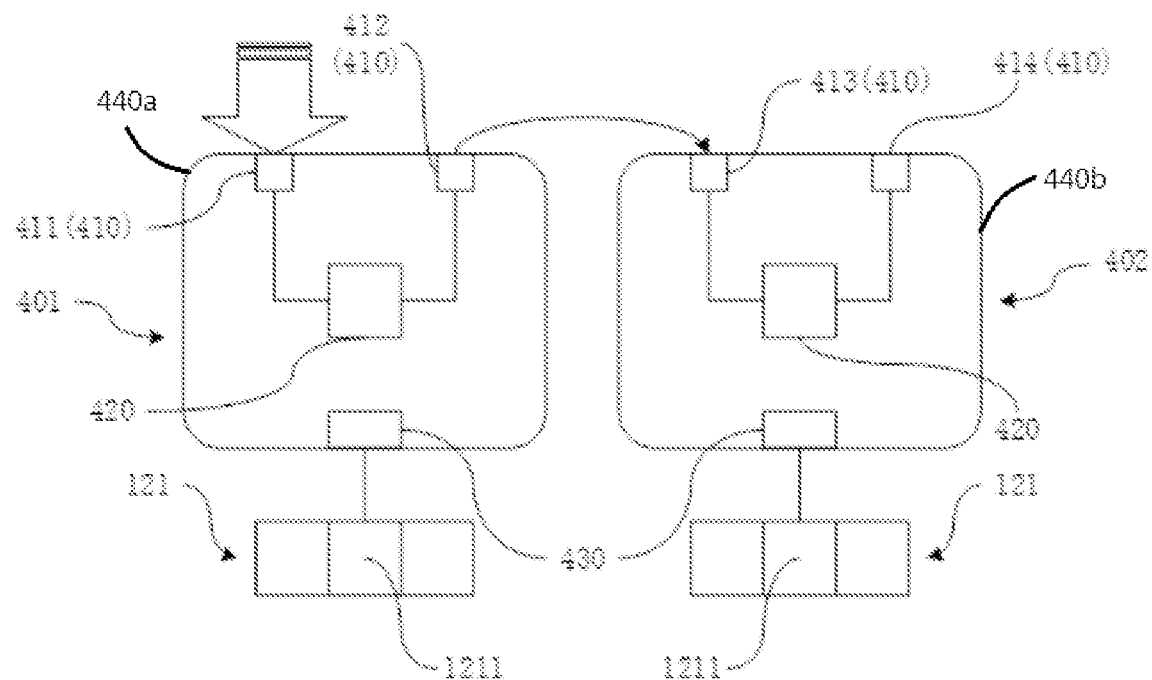
FIG. 12 is a schematic view illustrating the driving module according to one embodiment of the present application.

In some embodiments of the present disclosure, in further reference to FIG. 12, the above-mentioned driving module 400 comprises two driving sub-modules: a primary driving sub-module 401 and an auxiliary driving sub-module 402. The substrate 440 further comprises a first substrate portion 440a and a second substrate portion 440b. Each driving module 400 comprises one primary driving sub-module 401 disposed on the first substrate portion 440a and at least one auxiliary driving sub-module 402 disposed on the second substrate portion 440b. The auxiliary driving sub-module 402 is arranged on one side of the primary driving sub-module 401 along the joint 130. The supplementary display module 120 comprises a plurality of supplementary display sub-modules 121 corresponding to the primary driving sub-module 401 and the auxiliary driving sub-module 402. Each supplementary display sub-module 121 comprises a plurality of supplementary display units 1211. Both the primary driving sub-module 401 and the auxiliary driving sub-module 402 are electrically connected to the respectively corresponding supplementary display sub-modules 121.

The primary driving sub-module 401 and the auxiliary driving sub-module 402 are provided with the port units 410, the driving units 420, and the output units 430. The port unit 410 of the primary driving sub-module 401 comprises a receiving port and a transmitting port, that is, a primary receiving port 411 and a primary transmitting port 412. The port unit 410 of the auxiliary driving module 400 comprises a receiving port, that is, an auxiliary receiving port 413.

In the present embodiment, the primary receiving port 411 of the primary driving sub-module 401 is electrically connected to the distribution module 300, and the primary transmitting port 412 of the primary driving sub-module 401 is electrically connected to the primary receiving port 411 and the auxiliary receiving port 413 of the driving sub-module 402. The distribution module 300 sends the target sub-supplementary images 912 to the primary receiving port 411 of the primary driving sub-module 401. After receiving the target sub-supplementary images 912, the primary transmitting port 412 of the primary driving sub-module 401 sends the target sub-supplementary images 912 to the sub-receiving port 413 of the sub-driving sub-module 402. At the same time, the primary receiving port 411 of the primary driving sub-module 401 also sends the target sub-supplementary images 912 to the driving unit 420 of the primary driving sub-module 401 to control the supplementary display sub-module 121 corresponding to the primary driving sub-module 401 to perform display operations. Similarly, after receiving the target sub-supplementary images 912, the auxiliary receiving port 413 of the auxiliary driving sub-module 402 sends the target sub-supplementary images 912 to the driving unit 420 of the auxiliary driving sub-module 402 to control the supplementary display sub-module 121 corresponding to the auxiliary driving sub-module to perform display operations.

When there are multiple auxiliary driving sub-modules 402, the primary transmitting port 412 can be electrically connected to the auxiliary receiving port 413 of each sub-driving module 400 and distribute the target sub-supplementary images 912 to each auxiliary driving sub-module 402.

In the present application, each auxiliary driving sub-module 402 is also provided with a transmitting port, that is, an auxiliary transmitting port 414. The primary driving sub-module 401 and the auxiliary driving sub-modules 402 are connected in cascade. The primary driving sub-module 401 and the auxiliary driving sub-modules 402 are arranged in sequence along the joints 130. The auxiliary transmitting port 414 of each auxiliary driving sub-module 402 is electrically connected to the receiving port of the adjacent driving sub-module. The auxiliary receiving port 413 of each auxiliary driving sub-module 402 is electrically connected to the transmitting port of another adjacent driving sub-module. The primary driving sub-module 401 sends the sub-supplementary display images 812 to the auxiliary driving sub-module 402 adjacent to the primary driving sub-module 401, and the auxiliary driving sub-module 402 sends the sub-supplementary display images 812 to another auxiliary driving sub-module 402 adjacent to the foregoing auxiliary driving sub-module 402.

In the above embodiment, the primary driving sub-module 401 and the auxiliary driving sub-module 402 are respectively arranged corresponding to different supplementary display sub-modules 121, and a signal flow from the distribution module 300 first passes through the primary driving sub-module 401, and then passes through the auxiliary driving sub-module 402. That is, the auxiliary driving sub-module 402 is an extension of the primary driving sub-module 401.

Figure 13:
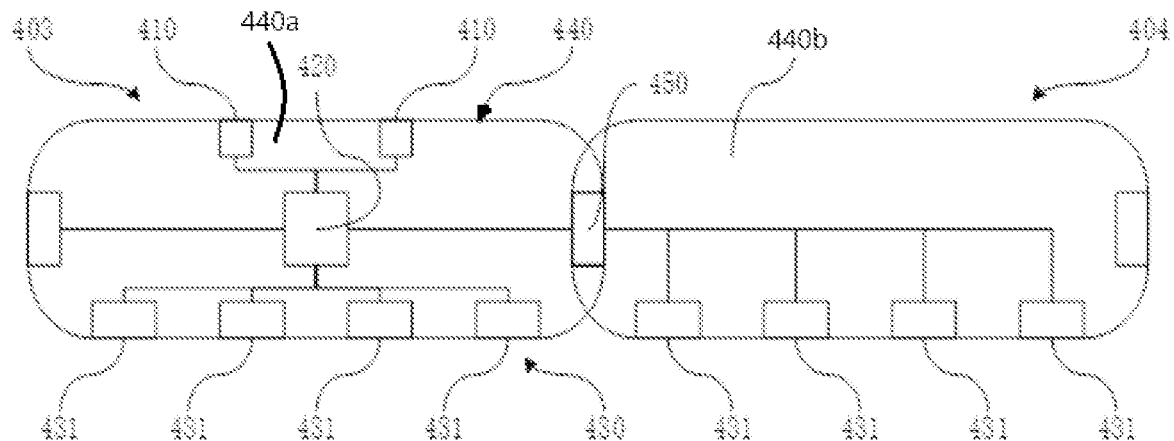
FIG. 13 is a schematic view illustrating a driving sub-module according to one embodiment of the present application.
Figure 14:
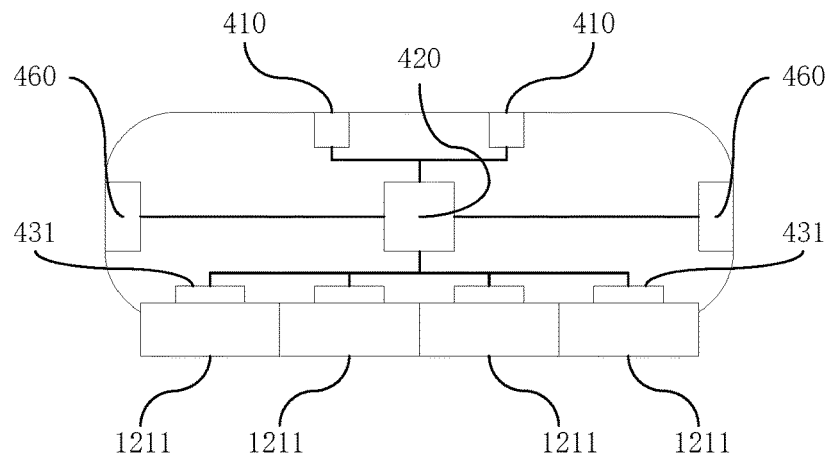
FIG. 14 is a schematic view illustrating a primary driving board according to one embodiment of the present application.

Please refer to FIGS. 13 and 14 in combination for some embodiments of the present application. The above-mentioned driving sub-module comprises at least one driving board. The at least one driving board comprises the substrate 440 and the port units 410, the driving units 420, and the output units 430 disposed on the substrate 440.

The output unit 430 comprises a plurality of display interfaces 431, and the supplementary display module 120 comprises a plurality of supplementary display units 1211. The display interfaces 431 are arranged on a same side, and are coupled and electrically connected to the corresponding supplementary display units 1211. The supplementary display units 1211 are spliced in order along a direction of the joints 130. The output unit 430 sends corresponding display information to the corresponding supplementary display units 1211 through the display interfaces 431.

Figure 15:
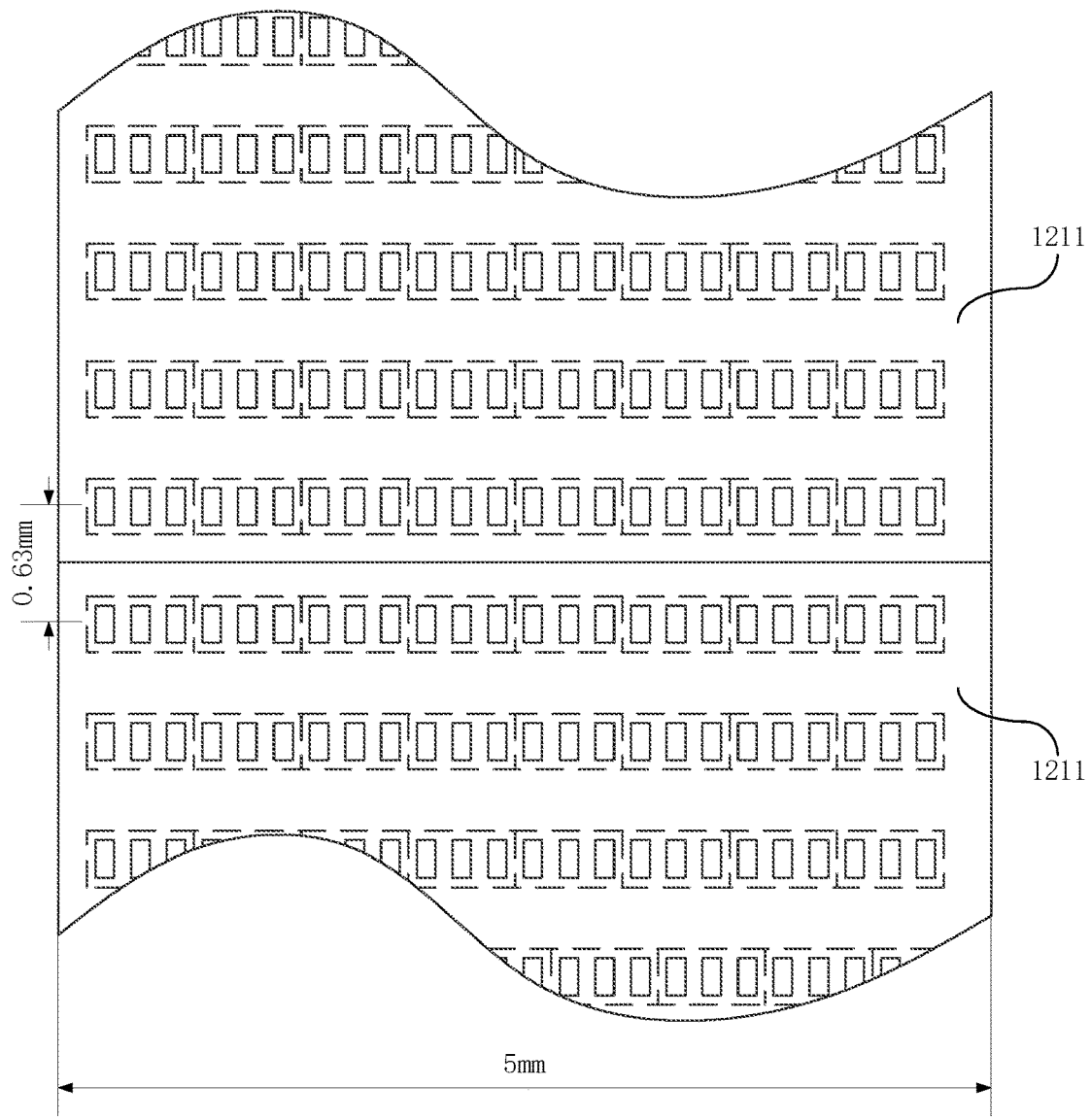
FIG. 15 is a schematic view illustrating a partial structure of a supplementary display unit according to one embodiment of the present application.

In the present embodiment, in further reference to FIG. 15, the above-mentioned supplementary display units 1211 are arranged in a strip shape along the joints 130, a border width of each supplementary display unit 1211 is less than 5 mm, and a pixel width of each supplementary display unit 1211 is greater than 8. A distance between adjacent pixels of two adjacent supplementary display units 1211 is less than 0.63 mm to ensure that a pixel density of the supplementary display module 120 is closer to a pixel density of the basic display module 110, thereby giving users a better visual experience.

When the above-mentioned driving sub-module comprises multiple driving boards, the multiple driving boards comprise a primary driving board 403 and an auxiliary driving board 404 connected to the primary driving board 403. Generally, the driving sub-module has one auxiliary driving board 404, and in other embodiments, the driving sub-module can also have two or more auxiliary driving boards 404. The auxiliary driving board 404 is arranged on one side of the primary driving board 403 along the joint 130, and electrical connection and structural connection are realized through an interface.

In one of the exemplary embodiments, as shown in FIG. 13, the substrate 440 further comprises a first substrate portion 440a and a second substrate portion 440b. The primary driving board 403 comprises the first substrate portion 440a and the port unit 410, the driving unit 420, the output unit 430, and an expansion interface 450 disposed on the first substrate portion 440a. The driving unit 420 is arranged in a middle of the substrate 440. The port unit 410 and the output unit 430 are arranged on two sides of the driving unit 420, respectively, and the expansion interface 450 is arranged at an end portion of the first substrate portion 440a.

In detail, the display interfaces 431 of the output unit 430 are disposed on a longer side of the first substrate portion 440a along the joint 130, and the expansion interface 450 is disposed on a shorter side of the first substrate portion 440a adjacent to the display interfaces 431.

The auxiliary driving board 404 comprises the second substrate portion 440b and comprises the output unit 430 and the expansion interface 450 disposed on the second substrate portion 440b. Same as the primary driving board 403, the display interfaces 431 of the output unit 430 are arranged on the longer side of the second substrate portion 440b along the joint 130, and the expansion interface 450 is arranged on the shorter side of the second substrate portion 440b adjacent to the display interfaces 431.

The primary driving board 403 and the auxiliary driving board 404 are coupled to each other (fixed to each other) through the expansion interfaces 450 to realize electrical connection. The primary driving board 403 sends the corresponding target sub-supplementary images 912 to the auxiliary driving board 404 through the expansion interface 450.

That is to say, in the present embodiment, after receiving the source image 800, the processing module 200 performs the first processing on the source image 800 to obtain the initial sub-basic images 801 corresponding to the basic display modules 110. Then, the distribution module 300 performs the second processing on the initial sub-basic images 801 to obtain the target sub-supplementary images 912 corresponding to the supplementary display modules 120 and the target sub-basic images 911 corresponding to the basic display modules 110. The target sub-basic images 911 are sent to the corresponding basic display modules 110 to perform display operations, and the target sub-supplementary images 912 are sent to the corresponding driving module 400.

The primary driving board 403 of the primary driving sub-module 401 of the driving module 400 receives the above-mentioned target sub-supplementary images 912, and sends the target sub-supplementary images 912 through the primary transmitting port 412 to the auxiliary driving sub-module 402 electrically connected to the primary transmitting port 412. At the same time, the primary driving board 403 of the primary driving sub-module 401 performs the third processing by the driving unit 420 on the primary driving board 403, converts the target sub-supplementary images 912 into image signals that can be displayed by the supplementary display units 1211, and distributes the image signals to the display interfaces 431 above the supplementary display units 1211 to display images. At the same time, the primary driving board 403 also sends the processed image signals to the auxiliary driving board 404 through the expansion interface 450, and the processed image signals are distributed to the display interfaces 431 on the auxiliary driving board 404, so that the supplementary display units 1211 coupled to the auxiliary driving board 404 can also perform display operations. The auxiliary driving sub-module 402 also comprises the primary driving board 403 and the auxiliary driving board 404, and has same execution steps as the execution steps of the primary driving module 400.

In other embodiments, there can be only one driving board. In this case, the driving board is the primary driving board 403. The auxiliary driving board 404 is an extension accessory for the primary driving board 403, which enables the driving unit 420 on the primary driving board 403 to control as many supplementary display units 1211 as possible, so as to save production costs and speed up transmission efficiency.

The above is a detailed description to the display device and the splicing-screen display device of the present application. Specific examples are used to explain the working principles and embodiments of the present application. The description of the above embodiments is only for ease of understanding the methods and main ideas of the present application. Those skilled in the art can change the embodiments and their applications according to the ideas of the present application. In conclusion, the contents of this specification should not be construed as a limitation to the present application.

What is claimed is:

1. A splicing-screen display device, comprising: a display module comprising a plurality of basic display modules and at least one supplementary display module, wherein the supplementary display module is arranged at a continuous joint and interleaved between each of more than two of the basic display modules;
 a processing module electrically connected to the display module, wherein the processing module is configured to perform first processing on a received source image to obtain initial sub-basic images corresponding to the basic display modules;
 a distribution module electrically connected to the processing module, wherein the distribution module is configured to receive the initial sub-basic images sent from the processing module, perform second processing to obtain a target sub-supplementary image corresponding to the supplementary display module and target sub-basic images corresponding to the basic display modules, send the target sub-supplementary image to the supplementary display module, and send the target sub-basic images to the basic display modules; and
 a driving module disposed corresponding to the supplementary display module and electrically connected to the distribution module and the supplementary display module, wherein the driving module is configured to receive the target sub-supplementary image from the distribution module and distribute the target sub-supplementary image to the supplementary display module for display operations of the supplementary display module,
 wherein the processing module comprises:
 a first receiving sub-module configured to receive pixel information of the display module and the source image, wherein the pixel information comprises a resolution of each of the basic display modules: and
 a first splitting sub-module configured to split the source image into the initial sub-basic images according to the resolutions of the basic display modules.

2. The splicing-screen display device according to claim 1, wherein the distribution module comprises:
 a second receiving sub-module configured to receive the pixel information of the display module and the initial sub-basic images, wherein the pixel information further comprises a resolution of the supplementary display module; and
 a second splitting sub-module configured to perform edge processing on the initial sub-basic images according to the resolution of the supplementary display module to form the target sub-supplementary image and the target sub-basic images.

3. The splicing-screen display device according to claim 2, wherein the second splitting sub-module comprises:
 an image cutting unit configured to cut the initial sub-basic images according to the resolution of the supplementary display module to form a sub-supplementary display image close to the joint and sub-basic display images away from the joint, a pixel width of the sub-supplementary display image is not greater than a pixel width of the supplementary display module;
 a first framing unit configured to add border display regions on outer sides of the sub-basic display images to form the target sub-basic images, wherein each border display region is parallel to the joint, and a pixel width of each border display region is equal to a pixel width of the sub-supplementary display image; and
 a second framing unit, wherein the second framing unit is configured to add border display regions on outer sides of the sub-supplementary display image to form the target sub-supplementary image, so that outer sides of the target sub-supplementary image are flush with outer sides of the target sub-basic images; or alternatively, the second framing unit is configured to directly convert the sub-supplementary display image into the target sub-supplementary image.

4. The splicing-screen display device according to claim 2, wherein the second splitting sub-module comprises:
 an image copying unit configured to, according to the resolution of the supplementary display module, copy along one side of each initial sub-basic image close to the joint to obtain the target sub-supplementary image; and
 an image forming unit configured to use the initial sub-basic images as the target sub-basic images.

5. The splicing-screen display device according to claim 1, wherein the driving module comprises:
 a substrate;
 a driving unit integrated on the substrate, wherein the driving unit is configured to perform third processing on the received target sub-supplementary image; and
 an output unit integrated on the substrate, wherein the output unit is electrically connected to the driving unit and the supplementary display module, and is configured to receive the target sub-supplementary image processed by the driving unit and distribute the processed target sub-supplementary image to the supplementary display module for the display operations of the supplementary display module.

6. The splicing-screen display device according to claim 5, wherein the driving module further comprises:
a port unit, wherein the port unit is electrically connected to the driving unit and the distribution module, wherein the port unit is configured to receive the target sub-supplementary image sent from the distribution module, and send the target sub-supplementary image to the driving unit.

7. The splicing-screen display device according to claim 6, wherein the supplementary display module comprises a plurality of supplementary display units, the output unit comprises a plurality of display interfaces, the display interfaces are arranged on a same side, and the display interfaces are coupled and electrically connected to the supplementary display units.

8. The splicing-screen display device according to claim 7, wherein the driving module comprises a driving board, the driving board comprises the substrate and also comprises the port unit, the driving unit, and the output unit disposed on the substrate.

9. The splicing-screen display device according to claim 8, wherein the driving module comprises the driving board, the substrate comprises a first substrate portion and a second substrate portion, wherein the driving board comprises:
a primary driving board comprising the first substrate portion, the port unit, the driving unit, the output unit, and an expansion interface; and
an auxiliary driving board arranged on one side of the primary driving board along the joint, wherein the auxiliary driving board comprises the second substrate portion, the output unit, and an expansion interface, and the primary driving board and the auxiliary driving board are coupled and electrically connected to each other through the expansion interfaces.

10. The splicing-screen display device according to claim 9, wherein the plurality of display interfaces are arranged along the joint on one side of the substrate and the expansion interfaces are arranged on one side of the substrate adjacent to the plurality of display interfaces.

11. The splicing-screen display device according to claim 7, wherein the supplementary display units are arranged in a strip shape along the feints joint, a border width of each supplementary display unit is less than 5 mm, and a pixel width of each supplementary display unit is greater than 8 pixels.

12. The splicing-screen display device according to claim 7, wherein a distance between adjacent pixels of two adjacent supplementary display units is less than 0.63 mm.

13. The splicing-screen display device according to claim 6, wherein driving module comprises a plurality of driving sub-modules, the driving sub-modules comprises a primary driving sub-module and a plurality of auxiliary driving sub-modules, the plurality of auxiliary driving sub-modules are disposed on one side of the primary driving sub-module along the joint, and the primary driving sub-module sends the target sub-supplementary images to the plurality of auxiliary driving sub-modules.

14. The splicing-screen display device according to claim 13, wherein each of the primary driving sub-module and the plurality of auxiliary driving sub-modules comprises the port unit, and the port unit comprises a receiving port and a transmitting port;
the receiving port on the primary driving sub-module is a primary receiving port, the receiving port on each auxiliary driving sub-module is an auxiliary receiving port, and the transmitting port on the primary driving sub-module is a primary transmitting port; and
the primary receiving port is electrically connected to the distribution module and configured to receive the target sub-supplementary image sent by the distribution module, and the primary transmitting port is electrically connected to the primary receiving port and the auxiliary receiving port and configured to send the target sub-supplementary image received by the primary receiving port to the auxiliary receiving port.

15. The splicing-screen display device according to claim 13, wherein the driving sub-modules comprise multiple auxiliary driving sub-modules, and the primary driving sub-module and the auxiliary driving sub-modules are connected in cascade.

16. The splicing-screen display device according to claim 15, wherein the primary driving sub-module and the auxiliary driving sub-modules are arranged sequentially along the joint.

17. The splicing-screen display device according to claim 13, wherein the driving sub-modules comprises at least one driving board, the substrate comprises a primary substrate portion and an auxiliary substrate portion, wherein the driving board comprises:
a primary driving board comprising the primary substrate portion, the port unit, the driving unit, the output unit, and an expansion interface; and
an auxiliary driving board arranged on one side of the primary driving board along the joint, wherein the auxiliary driving board comprises the auxiliary substrate portion, the output unit, and an expansion interface, and the primary driving board and the auxiliary driving board are coupled and electrically connected to each other through the expansion interfaces.

18. The splicing-screen display device according to claim 13, wherein the supplementary display module comprises a plurality of supplementary display sub-modules corresponding to the primary driving sub-module and the plurality of auxiliary driving sub-modules, and the primary driving sub-module and the plurality of auxiliary driving sub-modules are electrically connected to the supplementary display sub-modules, respectively.

19. The splicing-screen display device according to claim 18, wherein each supplementary display sub-module comprises a plurality of supplementary display units.

* * * * *